United States Patent
Mathew et al.

(10) Patent No.: US 10,854,611 B2
(45) Date of Patent: *Dec. 1, 2020

(54) MEMORY CELLS AND MEMORY ARRAYS

(71) Applicant: Micron Technology, Inc., Boise, ID (US)

(72) Inventors: Suraj J. Mathew, Boise, ID (US); Kris K. Brown, Garden City, ID (US); Raghunath Singanamalla, Boise, ID (US); Vinay Nair, Boise, ID (US); Fawad Ahmed, Boise, ID (US); Fatma Arzum Simsek-Ege, Boise, ID (US); Diem Thy N. Tran, Garden City, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/412,750

(22) Filed: May 15, 2019

(65) Prior Publication Data

US 2019/0267379 A1    Aug. 29, 2019

Related U.S. Application Data

(63) Continuation of application No. 16/033,377, filed on Jul. 12, 2018, now Pat. No. 10,319,724, which is a
(Continued)

(51) Int. Cl.
*H01L 27/108* (2006.01)
*H01L 29/78* (2006.01)
(Continued)

(52) U.S. Cl.
CPC ........ *H01L 27/108* (2013.01); *H01L 27/0207* (2013.01); *H01L 27/0688* (2013.01);
(Continued)

(58) Field of Classification Search
CPC ............. H01L 27/108; H01L 27/10841; H01L 27/10864; H01L 29/7827; H01L 2924/1436
See application file for complete search history.

(56) References Cited

U.S. PATENT DOCUMENTS 4,103,342 A    7/1978  Miersch et al.
4,554,570 A *  11/1985  Jastrzebski ............. H01L 21/28
                                                        257/331
(Continued)

FOREIGN PATENT DOCUMENTS

EP         0706187      4/1996
EP         17847159     2/2020
(Continued)

OTHER PUBLICATIONS

WO PCT/US2017/044611 IPRP, dated Mar. 5, 2019, Micron Technology, Inc.
(Continued)

*Primary Examiner* — Phat X Cao
(74) *Attorney, Agent, or Firm* — Wells St. John P.S.

(57) ABSTRACT

Some embodiments include a memory cell having a first transistor supported by a semiconductor base, and having second and third transistors above the first transistor and vertically stacked one atop the other. Some embodiments include a memory cell having first, second and third transistors. The third transistor is above the second transistor, and the second and third transistors are above the first transistor. The first transistor has first and second source/drain regions, the second transistor has third and fourth source/drain regions, and the third transistor has fifth and sixth source/drain regions. A read bitline is coupled with the sixth source/drain region. A write bitline is coupled with the first source/drain region. A write wordline includes a gate of the first transistor. A read wordline includes a gate of the
(Continued)

third transistor. A capacitor is coupled with the second source/drain region and with a gate of the second transistor.

3 Claims, 7 Drawing Sheets

Related U.S. Application Data continuation of application No. 15/664,217, filed on Jul. 31, 2017, now Pat. No. 10,056,386.

(60) Provisional application No. 62/381,685, filed on Aug. 31, 2016.

(51) Int. Cl.
*H01L 29/94* (2006.01)
*H01L 27/02* (2006.01)
*H01L 27/06* (2006.01)
*H01L 49/02* (2006.01)
*H01L 29/10* (2006.01)
*H01L 23/528* (2006.01)
*H01L 29/08* (2006.01)

(52) U.S. Cl.
CPC .. *H01L 27/10841* (2013.01); *H01L 27/10864* (2013.01); *H01L 28/60* (2013.01); *H01L 29/1037* (2013.01); *H01L 29/7827* (2013.01); *H01L 29/945* (2013.01); *H01L 23/528* (2013.01); *H01L 29/0847* (2013.01)

(56) References Cited

U.S. PATENT DOCUMENTS

| | | | |
|---|---|---|---|
| 5,066,607 A * | 11/1991 | Banerjee | G11C 11/404 257/E21.654 |
| 5,146,300 A | 9/1992 | Hamamoto et al. | |
| 5,299,155 A | 3/1994 | Yanagi | |
| 5,389,810 A | 2/1995 | Agata | |
| 5,398,200 A | 3/1995 | Mazure et al. | |
| 5,571,743 A | 11/1996 | Henkels et al. | |
| 5,586,078 A | 12/1996 | Takase et al. | |
| 5,646,900 A | 7/1997 | Tsukude et al. | |
| 5,830,791 A | 11/1998 | Lee et al. | |
| 5,898,608 A | 4/1999 | Hirano et al. | |
| 6,028,806 A | 2/2000 | Waller | |
| 6,141,286 A | 10/2000 | Vo et al. | |
| 6,154,387 A | 11/2000 | Takata | |
| 6,483,737 B2 | 11/2002 | Takeuchi et al. | |
| 6,563,727 B1 | 5/2003 | Roth et al. | |
| 6,710,465 B2 | 3/2004 | Song et al. | |
| 6,720,609 B2 | 4/2004 | Deboer et al. | |
| 6,744,087 B2 | 6/2004 | Misewich et al. | |
| 6,961,271 B2 | 11/2005 | Jeon et al. | |
| 7,164,595 B1 | 1/2007 | Shore et al. | |
| 7,330,388 B1 | 2/2008 | Chapman et al. | |
| 7,378,702 B2 * | 5/2008 | Lee | H01L 21/2007 257/295 |
| 7,408,218 B2 | 8/2008 | Akiyama et al. | |
| 7,558,097 B2 | 7/2009 | Khellah et al. | |
| 7,697,318 B2 | 4/2010 | Fukuda et al. | |
| 8,018,058 B2 * | 9/2011 | Lee | H01L 21/2007 257/758 |
| 8,212,311 B2 | 7/2012 | Masuoka et al. | |
| 8,394,699 B2 | 3/2013 | Haller et al. | |
| 8,866,208 B2 | 10/2014 | Lee | |
| 9,184,218 B2 | 11/2015 | Zhang et al. | |
| 9,343,507 B2 | 5/2016 | Takaki | |
| 9,378,780 B1 | 6/2016 | Chang et al. | |
| 9,419,003 B1 | 8/2016 | Colinge et al. | |
| 10,079,235 B2 | 6/2018 | Mathew et al. | |
| 10,020,311 B1 | 7/2018 | Li et al. | |
| 10,096,603 B2 | 10/2018 | Kim et al. | |
| 10,157,926 B2 | 12/2018 | Yang et al. | |
| 10,319,724 B2 * | 6/2019 | Mathew | H01L 27/10864 |
| 10,355,002 B2 | 7/2019 | Sills | |
| 10,381,357 B2 | 8/2019 | Karda et al. | |
| 2001/0053088 A1 | 12/2001 | Forbes | |
| 2002/0044477 A1 | 4/2002 | Takeuchi et al. | |
| 2002/0093865 A1 | 7/2002 | Agata | |
| 2002/0113260 A1 | 8/2002 | Yang et al. | |
| 2003/0087499 A1 | 5/2003 | Lane et al. | |
| 2003/0169616 A1 | 9/2003 | Noro | |
| 2003/0173593 A1 | 9/2003 | Miyatake | |
| 2003/0185041 A1 | 10/2003 | Takahashi et al. | |
| 2003/0202391 A1 | 10/2003 | Nishimura et al. | |
| 2003/0234413 A1 | 12/2003 | Sberno et al. | |
| 2004/0062101 A1 | 4/2004 | Kasuga | |
| 2004/0099886 A1 | 5/2004 | Rhodes et al. | |
| 2004/0151020 A1 | 8/2004 | Beer | |
| 2004/0174733 A1 | 9/2004 | Kirihata et al. | |
| 2004/0232497 A1 | 11/2004 | Akiyama | |
| 2004/0252542 A1 | 12/2004 | Hoya et al. | |
| 2006/0028859 A1 | 2/2006 | Forbes | |
| 2006/0046391 A1 | 3/2006 | Tang et al. | |
| 2006/0046424 A1 | 3/2006 | Chance et al. | |
| 2006/0138466 A1 | 6/2006 | Choi | |
| 2006/0164876 A1 | 7/2006 | Barth et al. | |
| 2006/0211194 A1 | 9/2006 | Haller | |
| 2007/0034928 A1 | 2/2007 | Cook et al. | |
| 2007/0161179 A1 | 7/2007 | Lee | |
| 2007/0295995 A1 | 12/2007 | Yun | |
| 2008/0079049 A1 | 4/2008 | Lee et al. | |
| 2009/0008691 A1 | 1/2009 | Lee et al. | |
| 2009/0108881 A1 | 4/2009 | Wilson | |
| 2009/0168489 A1 | 7/2009 | Madan et al. | |
| 2009/0212338 A1 | 8/2009 | Benson | |
| 2010/0112753 A1 * | 5/2010 | Lee | H01L 21/8221 438/107 |
| 2010/0165704 A1 | 7/2010 | Wu et al. | |
| 2010/0238697 A1 | 9/2010 | Juengling | |
| 2010/0264484 A1 | 10/2010 | Masuoka et al. | |
| 2010/0295110 A1 | 11/2010 | Takaishi | |
| 2012/0153371 A1 | 6/2012 | Chen et al. | |
| 2013/0099305 A1 | 4/2013 | Kim et al. | |
| 2013/0161607 A1 | 6/2013 | Yoneda | |
| 2013/0214420 A1 | 8/2013 | Shimamoto | |
| 2013/0221356 A1 | 8/2013 | Yamazaki | |
| 2013/0235641 A1 | 9/2013 | Iwaki | |
| 2013/0235642 A1 | 9/2013 | Heineck et al. | |
| 2014/0035018 A1 | 2/2014 | Lee | |
| 2014/0054718 A1 | 2/2014 | Karda et al. | |
| 2014/0220749 A1 | 8/2014 | Rutter | |
| 2015/0041885 A1 | 2/2015 | Yoshida et al. | |
| 2015/0078056 A1 | 3/2015 | Liu | |
| 2015/0102282 A1 | 4/2015 | Zhang et al. | |
| 2015/0318285 A1 | 11/2015 | Zhang | |
| 2016/0071843 A1 | 3/2016 | Kadoya | |
| 2016/0079247 A1 | 3/2016 | Lim et al. | |
| 2017/0053920 A1 | 2/2017 | Kim et al. | |
| 2017/0186782 A1 | 6/2017 | Lee et al. | |
| 2018/0061835 A1 | 3/2018 | Yang et al. | |
| 2018/0061840 A1 | 3/2018 | Sills | |
| 2018/0197864 A1 | 7/2018 | Sills | |
| 2019/0019544 A1 | 1/2019 | Derner et al. | |

FOREIGN PATENT DOCUMENTS

| | | |
|---|---|---|
| JP | H 03-205867 | 9/1991 |
| JP | H 08-147983 | 6/1996 |
| JP | H08-264764 | 10/1996 |
| JP | 2003-303901 | 10/2003 |
| JP | 2011-142256 | 7/2011 |
| KR | 10-2007-0070021 | 7/2007 |

OTHER PUBLICATIONS

WO PCT/US2017/044611 Search Report, dated Nov. 13, 2017, Micron Technology, Inc.
WO PCT/US2017/044611, Writ. Opin., dated Nov. 13, 2017, Micron Technology, Inc.

(56) References Cited

OTHER PUBLICATIONS

WO PCT/US2017/044633 IPRP, dated Mar. 14, 2019, Micron Technology, Inc.
WO PCT/US2017/044633 Search Rept., dated Nov. 13, 2017, Micron Technology, Inc.
WO PCT/US2017/044633 Writ. Opin., dated Nov. 13, 2017, Micron Technology, Inc.
WO PCT/US2017/044638 IPRP, dated Mar. 5, 2019, Micron Technology, Inc.
WO PCT/US2017/044638 Search Rept., dated Nov. 15, 2017, Micron Technology, Inc.
WO PCT/US2017/044638 Writ. Opin., dated Nov. 15, 2017, Micron Technology, Inc.
WO PCT/US2017/044653 IPRP, dated Mar. 5, 2019, Micron Technology, Inc.
WO PCT/US2017/044653 Search Rept., dated Nov. 10, 2017, Micron Technology, Inc.
WO PCT/US2017/044653 Writ. Opin., dated Nov. 10, 2017, Micron Technology, Inc.
WO PCT/US2017/044661 IPRP, dated Mar. 5, 2019, Micron Technology, Inc.
WO PCT/US2017/044661 Search Rept., dated Nov. 8, 2017, Micron Technology, Inc.
WO PCT/US2017/044661 Writ. Opin., dated Nov. 8, 2017, Micron Technology, Inc.
WO PCT/US2017/045052 IPRP, dated Mar. 5, 2019, Micron Technology, Inc.
WO PCT/US2017/045052 Search Rept., dated Nov. 10, 2017, Micron Technology, Inc.
WO PCT/US2017/045052 Writ. Opin., dated Nov. 10, 2017, Micron Technology, Inc.
WO PCT/US2017/068227 Search Rept., dated Apr. 17, 2018, Micron Technology, Inc.
WO PCT/US2017/068227 Writ. Opin., dated Apr. 17, 2018, Micron Technology, Inc.
WO PCT/US2017/041312 Search Rept., dated Nov. 7, 2018, Micron Technology, Inc.
WO PCT/2018/041312 Writ. Opin., dated Nov. 7, 2018, Micron Technology, Inc.
TW 106128404 SR Trans., dated Aug. 29, 2018, Micron Technology, Inc.
TW 107100862 SR Trans., dated Aug. 2, 2018, Micron Technology, Inc.
Chun et al., "A 3T Gain Cell Embedded DRAM Utilizing Preferential Boosting for High Density and Low Power On-Die Caches", IEEE Journal of Solid-State Circuits vol. 46, No. 6, Jun. 2011, United States, pp. 1495-1505.
Henkels et al., "Large-Signal 2T, 1C DRAM Cell: Signal and Layout Analysis", IEEE Journal of Solid-State Circuits vol. 29, No. 7, Jul. 1994, United States, pp. 829-832.
Hewes, "Circuit Diagrams", available online at https://electronicsclub.info/circuitdiagrams.htm, Dec. 14, 2018, pp. 1-3.
WO PCT/US2017/068227 IPRP, dated Jul. 16, 2019, Micron Technology, Inc.
EP 17847169 Supplementary SR, dated Feb. 19, 2020, Micron Technology, Inc.
EP17847156 Partial Search Rept, dated Mar. 4, 2020, Micron Technology, Inc.
PCT/US2018/041312 IPRP, dated Mar. 12, 2020, Micron Technology, Inc.
EP 17847157.9 Supplemental SR, dated Feb. 20, 2020, Micron Technology, Inc.
EP 17847158.7 Partial SR, dated Feb. 18, 2020, Micron Technology, Inc.
EP 17847158 Supplementary SR, dated May 12, 2020, Micron Technology, Inc.
TW 108138429 SR Translation, dated Apr. 20, 2020, Micron Technology, Inc.
Wei et al., "A New High-Reliable 2T/1C FeRAM Cell", Integrated Ferroelectrics vol. 81, 2006, Switzerland, pp. 149-155.

\* cited by examiner

MEMORY CELLS AND MEMORY ARRAYS

RELATED PATENT DATA

This patent resulted from a continuation of U.S. patent application Ser. No. 16/033,377 which was filed Jul. 12, 2018, which is a divisional of U.S. patent application Ser. No. 15/664,217 which was filed Jul. 31, 2017, now issued as U.S. Pat. No 10,056,386, which claims priority to U.S. Provisional Patent Application Ser. No. 62/381,685, which was filed Aug. 31, 2016, each of which is hereby incorporated by reference in its entirety.

TECHNICAL FIELD

Memory cells, such as memory cells having three transistors and a capacitor (i.e., 3T-1C memory cells). Memory arrays comprising 3T-1C memory cells.

BACKGROUND

A prior art memory cell configuration utilizes a single capacitor in combination with three transistors, and may be referred to as a 3T-1C memory cell. Such memory cell is schematically illustrated in FIG. 1 as a memory cell 2. The three transistors are labeled as T1, T2 and T3.

A source/drain region of T1 connects with a write bitline (WBL), and the other source/drain region of T1 connects with the capacitor (CAP). A gate of T1 connects with a write wordline (WWL).

A source/drain region of T2 connects with a common plate (CP), and the other source/drain region of T2 connects with a source/drain region of T3. The common plate may be coupled with any suitable voltage, such as a voltage within a range of from greater than or equal to ground to less than or equal to VCC (i.e., ground≤CP≤VCC). In some applications the common plate is at a voltage of about one-half VCC (i.e., about VCC/2).

A gate of T2 connects with the capacitor (CAP).

One of the source/drain regions of T3 is the source/drain region connected with the source/drain region of T2, and the other connects with a read bitline (RBL). A gate of T3 connects with a read wordline (RWL).

The 3T-1C configuration of FIG. 1 may be utilized in DRAM (dynamic random access memory). Presently, DRAM commonly utilizes memory cells having one capacitor in combination with a transistor (so-called 1T-1C memory cells), with the capacitor being coupled with a source/drain region of the transistor. A possible advantage of 3T-1C configurations as compared to 1T-1C configurations is that charge stored on the capacitor within the 3T-1C configurations is utilized to control a gate of T2 rather than being directly shared with a bitline. This may enable much lower capacitance to be utilized in the 3T-1C configurations as compared to the 1T-1C configurations. One of the limitations to scalability of present 1T-1C configurations is that it is proving difficult to incorporate capacitors having sufficiently high capacitance into highly-integrated architectures. Accordingly, utilization of 3T-1C configurations, and the associated lower capacitance needs of such configurations, may ultimately enable increased scalability as compared to the 1T-1C configurations. However, the 3T-1C configurations have more components than the 1T-1C configurations (three transistors instead of one), which may make it difficult to incorporate 3T-1C configurations into highly-integrated modern memory architecture.

It would be desirable to develop 3T-1C configurations suitable for incorporation into highly-integrated modern memory architectures.

DETAILED DESCRIPTION OF THE ILLUSTRATED EMBODIMENTS

Figure 1:
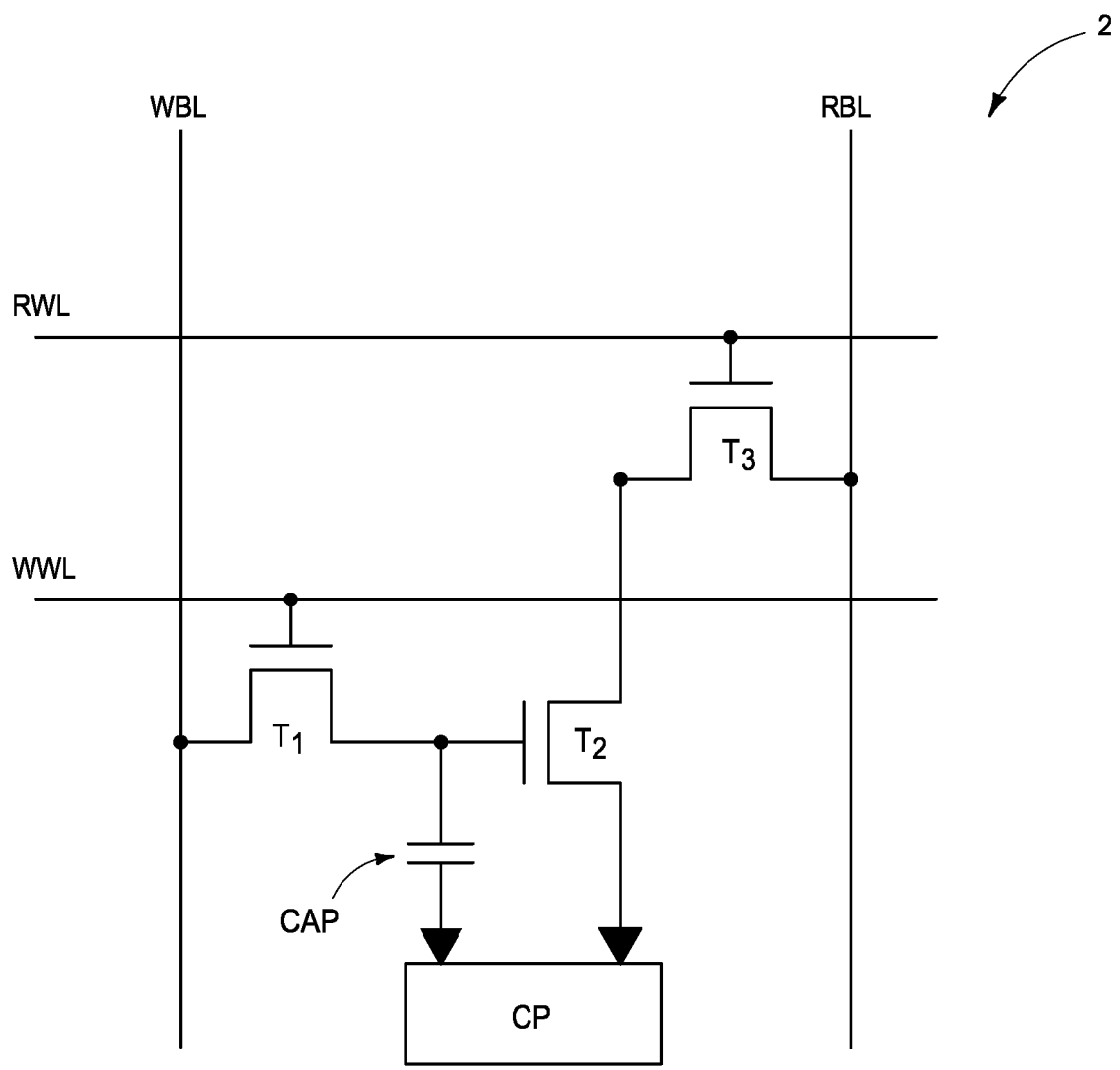
FIG. 1 is a schematic diagram of a prior art memory cell having 3 transistors and 1 capacitor.
Figure 2:
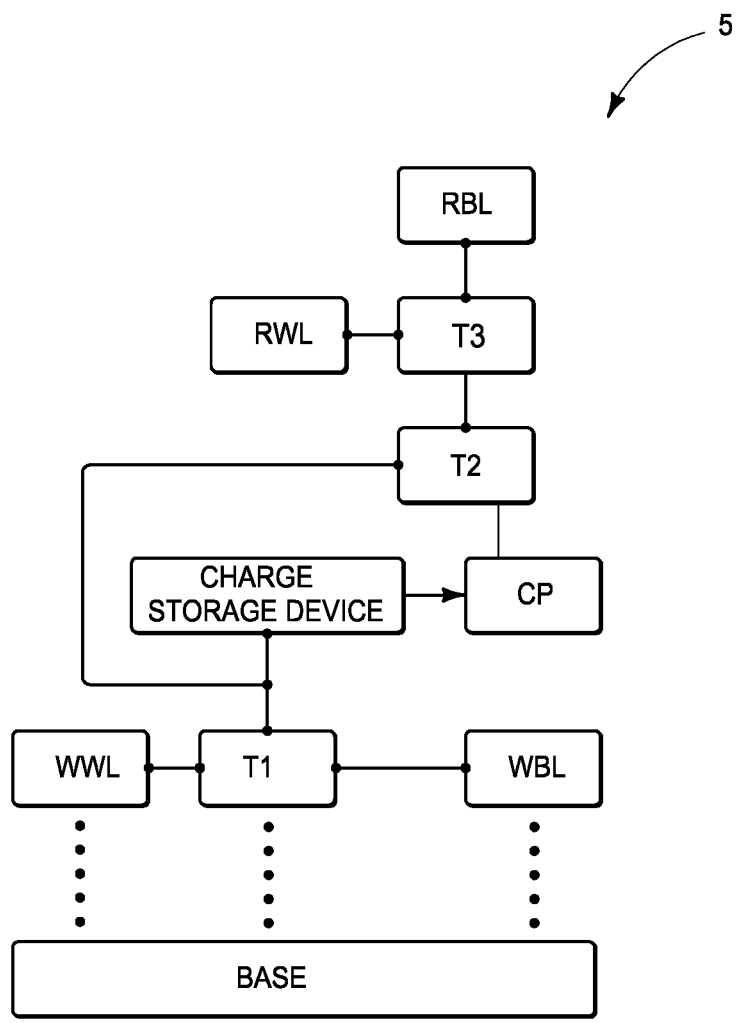
FIG. 2 is a block diagram illustrating example configurations for memory cells having 3 transistors and 1 capacitor.

Some embodiments include 3T-1C configurations in which two or more components are vertically stacked relative to one another. Such vertical stacking may increase integration. FIG. 2 diagrammatically illustrates an example embodiment 3T-1C memory cell architecture 5. The architecture includes the transistor T1 supported by a base.

The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base may correspond to a semiconductor substrate containing one or more materials associated with integrated circuit fabrication. Such materials may include, for example, one or more of refractory metal materials, barrier materials, diffusion materials, insulator materials, etc.

The gate of transistor T1 is electrically coupled to a write wordline (WWL), and a source/drain region of T1 is electrically coupled with a write bitline (WBL). In the embodiment, the write wordline and write bitline are shown to be at about a common elevational level as T1. In other embodiments, one or both of the write wordline and write bitline may be vertically shifted relative to T1.

The transistors T2 and T3 are above T1, with T3 being vertically stacked over T2. In some embodiments T3 may be directly above T2, as illustrated; and in other embodiments T3 may be horizontally shifted relative to T2 in addition to being vertically shifted relative to T2.

A source/drain region of T3 is electrically coupled with a source/drain region of T2. The other source/drain region of T3 is electrically coupled to a read bitline (RBL), and the gate of T3 is electrically coupled with a read wordline (RWL). Although both a read bitline (RBL) and write bitline (WBL) are illustrated, in some embodiments the RBL and WBL may be electrically coupled to one another and operate as a single bitline.

A first node of a charge-storage device is electrically coupled in common to a source/drain region of T1 and a gate of T2, and a second node of the charge-storage device is electrically coupled to a common plate (CP). The charge-storage device may be a capacitor (for instance, a ferroelectric capacitor or a non-ferroelectric capacitor), or any other suitable device. In some embodiments the charge-storage device may be a separate component, such as, for example, a capacitor. In other embodiments, the charge-storage device may be part of T2. For example, the charge-storage device may correspond to the capacitive properties associated with gate dielectric material of T2. Various example configurations of the charge-storage device are described in more detail with reference to specific embodiments of FIGS. 3, 5 and 6.

A source/drain region of T2 is electrically coupled with the common plate (CP).

The transistor T1, write wordline and write bitline are shown spaced from the base to indicate that there may be one or more intervening materials or components between such structures and the base in some embodiments.

The example architecture of FIG. 2 illustrates that some embodiments include 3T-1C configurations in which the transistor T3 is vertically stacked over transistor T2, and in which both of the transistors T2 and T3 are over the transistor T1. Specific example embodiments of stacking arrangements and specific example embodiments of various components of example 3T-1C architectures are described below with reference to FIGS. 3-12.

Figure 3:
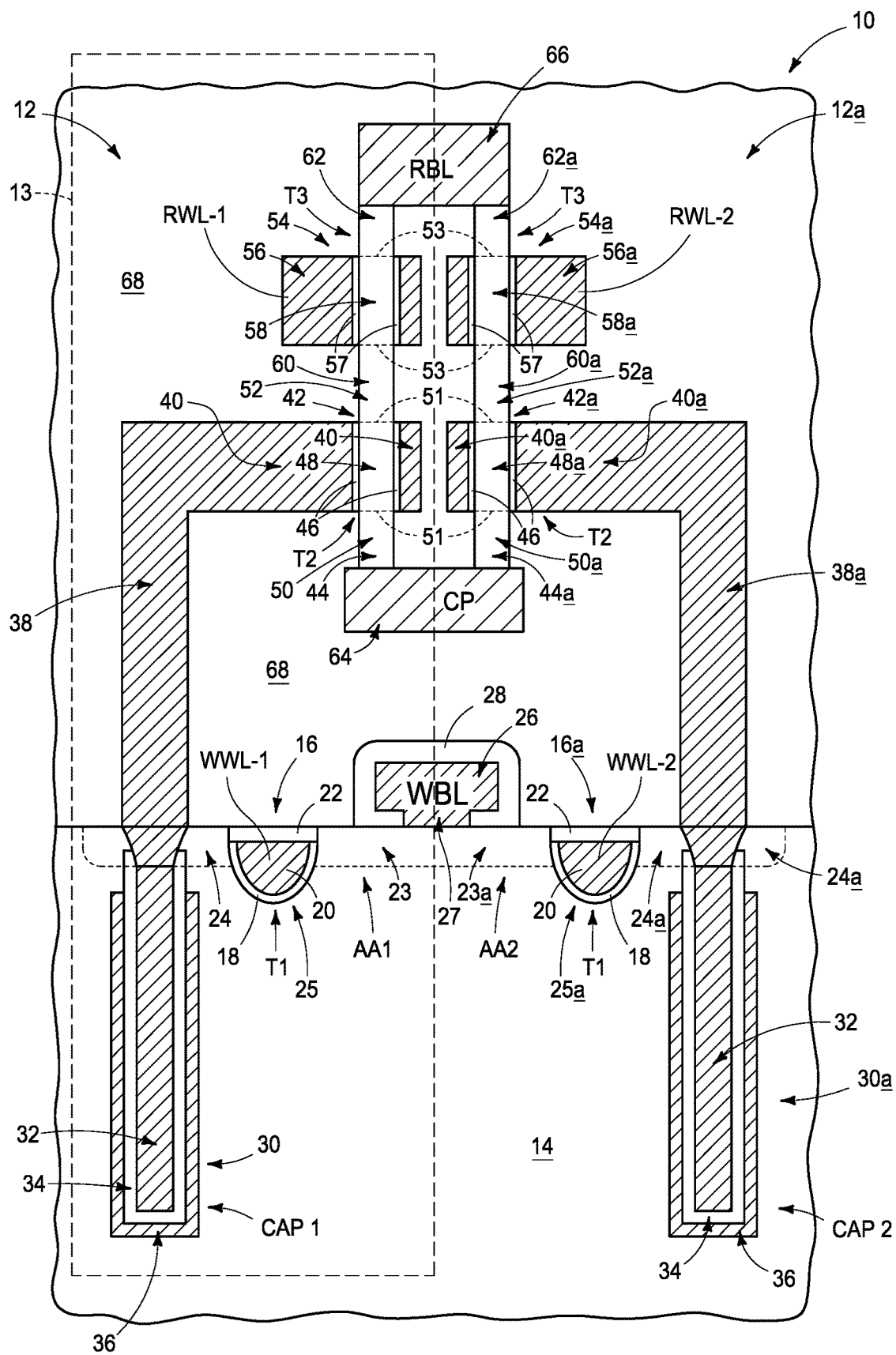
FIG. 3 is a diagrammatic cross-sectional side view of a region of a memory array showing an example configuration for memory cells having 3 transistors and 1 capacitor.

Referring to FIG. 3, a portion of a memory array 10 is illustrated. The memory array includes 3T-1C memory cells. An example memory cell 12 is within a region demarcated by a dashed line 13, and an adjacent memory cell 12a is also shown in the illustrated portion of memory array 10.

The illustrated portion of memory array 10 includes a base 14. Such base may comprise any of the materials described above relative to the base of FIG. 2. Recessed transistors 16 and 16a extend into base 14. Such transistors include gate dielectric material 18 and a conductive gate material 20 over the gate dielectric material. The conductive gate material is comprised by write wordlines that extend in and out of the page relative to the cross-section of FIG. 3, with the write wordline of memory cell 12 being labeled as WWL-1 and the write wordline of memory cell 12a being labeled as WWL-2.

The gate dielectric material 18 may comprise any suitable composition or combination of compositions, including, for example, silicon oxide, high-K dielectric materials, etc.

The conductive gate material 20 may comprise any suitable composition or combination of compositions, including, for example, one or more of various metals (e.g., tungsten, titanium, etc.), metal-containing materials (for instance, metal nitride, metal silicide, metal carbide, etc.), conductively-doped semiconductor materials (for instance, conductively-doped silicon, conductively-doped germanium, etc.), etc.

Insulative material 22 is provided over the conductive gate material 20. Such insulative material may comprise any suitable composition or combination of compositions, including, for example, silicon dioxide, silicon nitride, etc.

Although the illustrated transistors 16 and 16a are shown as recessed devices, in other embodiments the transistors may be planar devices or other suitable devices. The transistors 16 and 16a correspond to the T1 transistors of memory cells 12 and 12a, respectively.

The transistor 16 comprises conductively-doped source/drain regions 23 and 24, and a channel region 25 extending between the source/drain regions 23 and 24. The source/drain regions 23 and 24 may be referred to as a first source/drain region and a second source/drain region, respectively; and the channel region 25 may be referred to as a first channel region. The transistor 16a comprises source/drain regions 23a and 24a analogous to the regions 23 and 24 of transistor 16, and also comprises a channel region 25a between the source/drain regions 23a and 24a.

The source/drain regions 23 and 24 of transistor 16 are within an active area labeled as AA1, and the source/drain regions 23a and 24a of transistor 16a are within an active area labeled as AA2.

A write bitline (WBL) 26 is between the transistors 16 and 16a, and is electrically coupled with the first source/drain regions 23 and 23a through a bit contact 27. Accordingly, the write bitline 26 is shared by the adjacent transistors 16 and 16a. In the illustrated embodiment, an electrically insulative shell 28 extends around the write bitline 26. The electrically insulative shell may comprise any suitable composition or combination of compositions, such as, for example, silicon dioxide, silicon nitride, etc.

The write bitline 26 may comprise any suitable electrically conductive composition or combination of electrically conductive compositions; including, for example, one or more of various metals (e.g., tungsten, titanium, etc.), metal-containing materials (for instance, metal nitride, metal silicide, metal carbide, etc.), conductively-doped semiconductor materials (for instance, conductively-doped silicon, conductively-doped germanium, etc.), etc.

The second source/drain regions 24 and 24a extend to capacitors 30 and 30a, respectively. Such capacitors may be alternatively referred to as CAP1 and CAP2. The capacitors are examples of charge storage devices that may be utilized with the memory cells 12 and 12a.

Each of the capacitors has an inner node (or first node) 32, a capacitor dielectric material 34, and an outer node (or second node) 36. The inner node 32 and outer node 36 may comprise any suitable electrically conductive compositions or combinations of electrically conductive compositions; including, for example, one or more of various metals (e.g., tungsten, titanium, etc.), metal-containing materials (for instance, metal nitride, metal silicide, metal carbide, etc.), conductively-doped semiconductor materials (for instance, conductively-doped silicon, conductively-doped germanium, etc.), etc. The inner nodes 32 and outer nodes 36 may comprise the same composition as one another in some embodiments, and in other embodiments may comprise different compositions relative to one another.

The capacitor dielectric material 34 may comprise any suitable composition or combination of compositions. In some embodiments, the capacitor dielectric material may comprise non-ferroelectric material and may, for example, consist of one or more of silicon dioxide, silicon nitride, aluminum oxide, hafnium oxide, zirconium oxide, etc. In some embodiments the capacitor dielectric material may comprise ferroelectric material. For instance, the capacitor dielectric material may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element.

In the illustrated embodiment the outer nodes 36 are directly against semiconductor material of base 14. In such embodiments the semiconductor material of the base may be at a common plate voltage, and accordingly provides a common plate contact electrically coupled with the outer nodes 36. In other embodiments the outer nodes may be electrically isolated from the base 14 by one or more insulative materials (not shown), and may be electrically coupled with wires or other suitable conductive structures (not shown) formed to extend within base 14.

The inner nodes 32 are electrically coupled with the second source/drain regions 24 and 24a of T1 transistors 16 and 16a. The inner nodes may comprise a single material which extends downwardly through the source/drain regions and into the base 14 (as shown), or may comprise multiple different materials.

The inner nodes 32 are electrically coupled with interconnects 38 and 38a, and such interconnects extend to gates 40 and 40a of T2 transistors 42 and 42a.

The interconnects (38 and 38a) and gates (40 and 40a) may comprise any suitable electrically conductive compositions or combinations of electrically conductive compositions; including, for example, one or more of various metals (e.g., tungsten, titanium, etc.), metal-containing materials (for instance, metal nitride, metal silicide, metal carbide, etc.), conductively-doped semiconductor materials (for instance, conductively-doped silicon, conductively-doped germanium, etc.), etc. In the shown embodiment the interconnects (38 and 38a) and gates (40 and 40a) comprise a single homogeneous electrically conductive material. In other embodiments the gates may comprise different electrically conductive materials than the interconnects.

Semiconductor material pillars 44 and 44a extend through the gates 40 and 40a, with semiconductor material of pillars 44 and 44a being spaced from conductive material of gates 40 and 40a by gate dielectric material 46. The gate dielectric material may comprise any suitable composition or combination of compositions; and may, for example, comprise one or more of, silicon oxide, high-K dielectric materials, etc. The pillars 44 and 44a may comprise any suitable semiconductor materials or combinations of semiconductor materials; such as, for example, silicon, germanium, etc.

The T2 transistors 42 and 42a comprise channel regions 48 and 48a within semiconductor material of pillars 44 and 44a. Transistor 42 comprises source/drain regions 50 and 52 on opposing sides of channel region 48 and electrically coupled with one another through the channel region; with approximate boundaries between the source/drain regions and the channel region being illustrated with dashed-lines 51. Similarly, transistor 42a comprises source/drain regions 50a and 52a on opposing sides of channel region 48a. The transistors 42 and 42a may be referred to as second transistors to distinguish them from the first transistors (16 and 16a). The channel regions 48 and 48a may be referred to as second channel regions to distinguish them from the first channel regions (25 and 25a) of the first transistors. The source/drain regions 50 and 52 may be referred to as third and fourth source/drain regions, respectively to distinguish them from the first and second source/drain regions 23 and 24 of the first transistor 25; and similarly the source/drain regions 50a and 52a may be referred to as third and fourth source/drain regions.

The semiconductor material pillars extend upwardly through T3 transistors 54 and 54a, and such T3 transistors may be referred to as third transistors.

The third transistors 54 and 54a have gates 56 and 56a connected to read wordlines, with the read wordline of memory cell 12 being labeled as RWL-1 and the read wordline of memory cell 12a being labeled as RWL-2. The gates 56 and 56a may comprise any suitable electrically conductive material, such as, for example, one or more of the materials described previously with reference to the gates 42 and 42a of the second transistors T2.

Semiconductor material of pillars 44 and 44a is spaced from conductive material of gates 56 and 56a by gate dielectric material 57. Such gate dielectric material may comprise any suitable composition or combination of compositions; and may, for example, comprise one or more of, silicon oxide, high-K dielectric materials, etc.

The third transistors 54 and 54a have channel regions 58 and 58a within the semiconductive material of pillars 44 and 44a. Transistor 54 comprises source/drain regions 60 and 62 on opposing sides of channel region 58 and electrically coupled with one another through the channel region; with approximate boundaries between the source/drain regions and the channel region being illustrated with dashed-lines 53. Similarly, transistor 54a comprises source/drain regions 60a and 62a on opposing sides of channel region 58a. The channel regions 58 and 58a may be referred to as third channel regions. The source/drain regions 60 and 62 may be referred to as fifth and sixth source/drain regions, respectively; and similarly the source/drain regions 60a and 62a may be referred to as fifth and sixth source/drain regions.

In the shown embodiment the fifth source/drain regions 60 and 60a of transistors T3 overlap the fourth source/drain regions 52 and 52a of transistors T2 within semiconductor pillars 44 and 44a; and in practice the fourth source/drain regions may be effectively identical and coextensive with the fifth source/drain regions. In other embodiments the fifth source/drain regions may be separated from the fourth source/drain regions, and electrically coupled to the fourth source/drain regions through interconnects (not shown).

The source/drain regions of transistors T1, T2 and T3 may be doped with any suitable to dopants to any suitable conductivity types. For instance, the source/drain regions of the transistors may be majority n-type doped in some applications, and may be majority p-type doped in other applications.

In the illustrated embodiment the semiconductor pillars 44 and 44a extend from a lower electrical node 64 to an upper electrical node 66. The nodes 64 and 66 may comprise any suitable electrically conductive materials, including, for example, one or more of various metals (e.g., tungsten, titanium, etc.), metal-containing materials (for instance, metal nitride, metal silicide, metal carbide, etc.), conductively-doped semiconductor materials (for instance, conductively-doped silicon, conductively-doped germanium, etc.), etc. The nodes 64 and 66 may comprise the same composition as one another in some embodiments, and may be different compositions relative to one another in other embodiments.

The node 64 is electrically coupled to common plate (CP) voltage, and the node 66 is part of a read bitline (RBL).

In the illustrated embodiment the third transistors T3 are vertically stacked over the second transistors T2; a common plate (CP) connection 64 is vertically under the second transistors T2 and electrically coupled with source/drain regions (e.g. 50/50a) of the second transistors, and a read bitline 66 is over the third transistors T3 and electrically coupled with source/drain regions (e.g., 62/62a) of the third transistors.

Insulative material 68 is shown to surround the various components of memory cells 12 and 12a. Such insulative material may comprise any suitable composition or combination of compositions; including, for example, one or more of silicon dioxide, silicon nitride, borophosphosilicate glass, spin-on dielectric, etc. Although insulative material 68 is shown as a single homogeneous material, in other embodiments the insulative material may include two or more discrete insulative compositions.

In the illustrated embodiment of FIG. 3 the capacitors 30 and 30a extend downwardly into base 14 and below gates of the first transistors T1. In other embodiments the capacitors may have other configurations and locations (with examples of such other embodiments being described below with reference to FIGS. 5-7).

Figure 4:
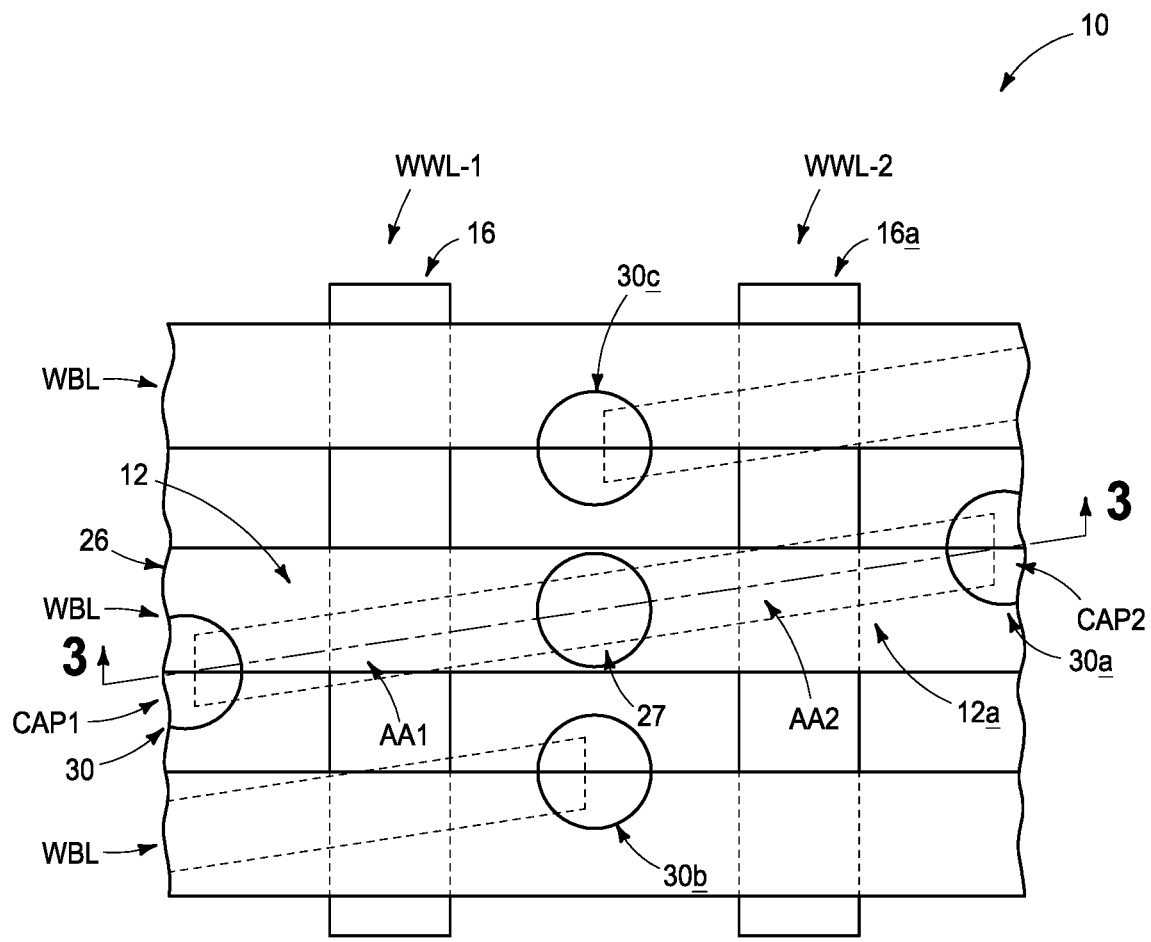
FIG. 4 is a diagrammatic top view of the memory array of FIG. 3.

FIG. 4 is a top view of a region of memory array 10 showing an example embodiment relationship between the write wordlines (WWL-1 and WWL-2) 16 and 16a, the write bitline (WBL) 26, the bit contact 27, the capacitors 30 and 30a (CAP1 and CAP2), and the active areas AA1 and AA2. The cross-section of FIG. 3 is along the line 3-3 of FIG. 4. The read wordlines and read bitlines are not shown in FIG. 4 in order to simplify the drawing. Additional capacitors 30b and 30c are also shown in the view of FIG. 4.

Figure 5:
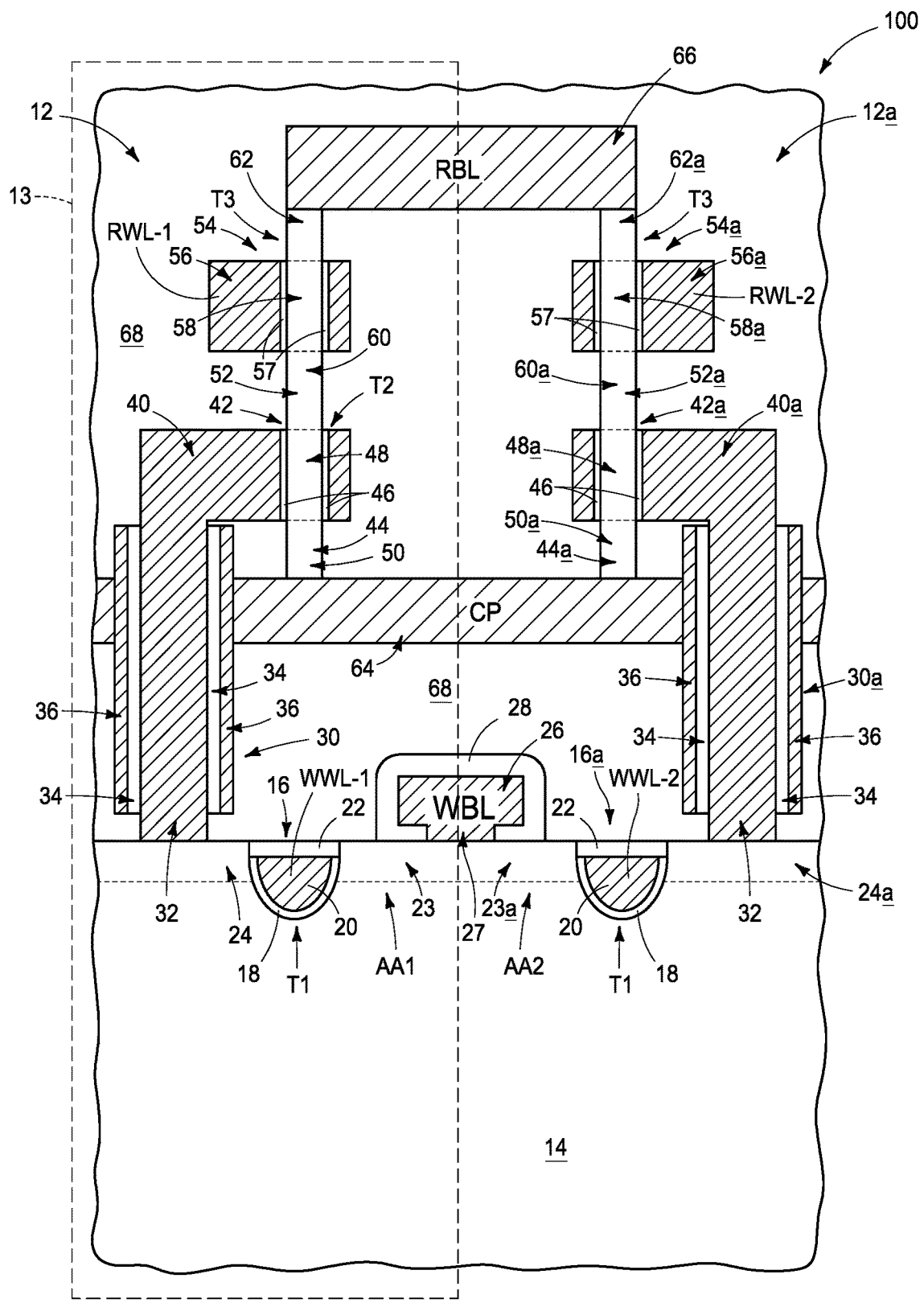
FIGS. 5 and 6 are diagrammatic cross-sectional side views of memory arrays illustrating additional example configurations for memory cells having 3 transistors and 1 capacitor.

FIG. 5 shows a portion of an example embodiment memory array 100 illustrating an alternative configuration of capacitors 30 and 30a in the 3T-1C memory cells 12 and 12a.

The capacitors 30 and 30a of FIG. 5 extend upwardly from base 14, and are between the second source/drain regions of the T1 transistors (i.e., source/drain regions 24 and 24a) and the gates of the T2 transistors (i.e., gates 40 and 40a). In the illustrated embodiment the inner nodes 32 electrically couple with gates 40, and the outer nodes 36 electrically couple with common plate (CP) connection 64. Although a single homogeneous conductive material is illustrated as extending across the inner nodes 32 and the gates 40 and 40a, in other embodiments such homogeneous material may be replaced by conductive material comprising two or more discrete compositions.

Figure 6:
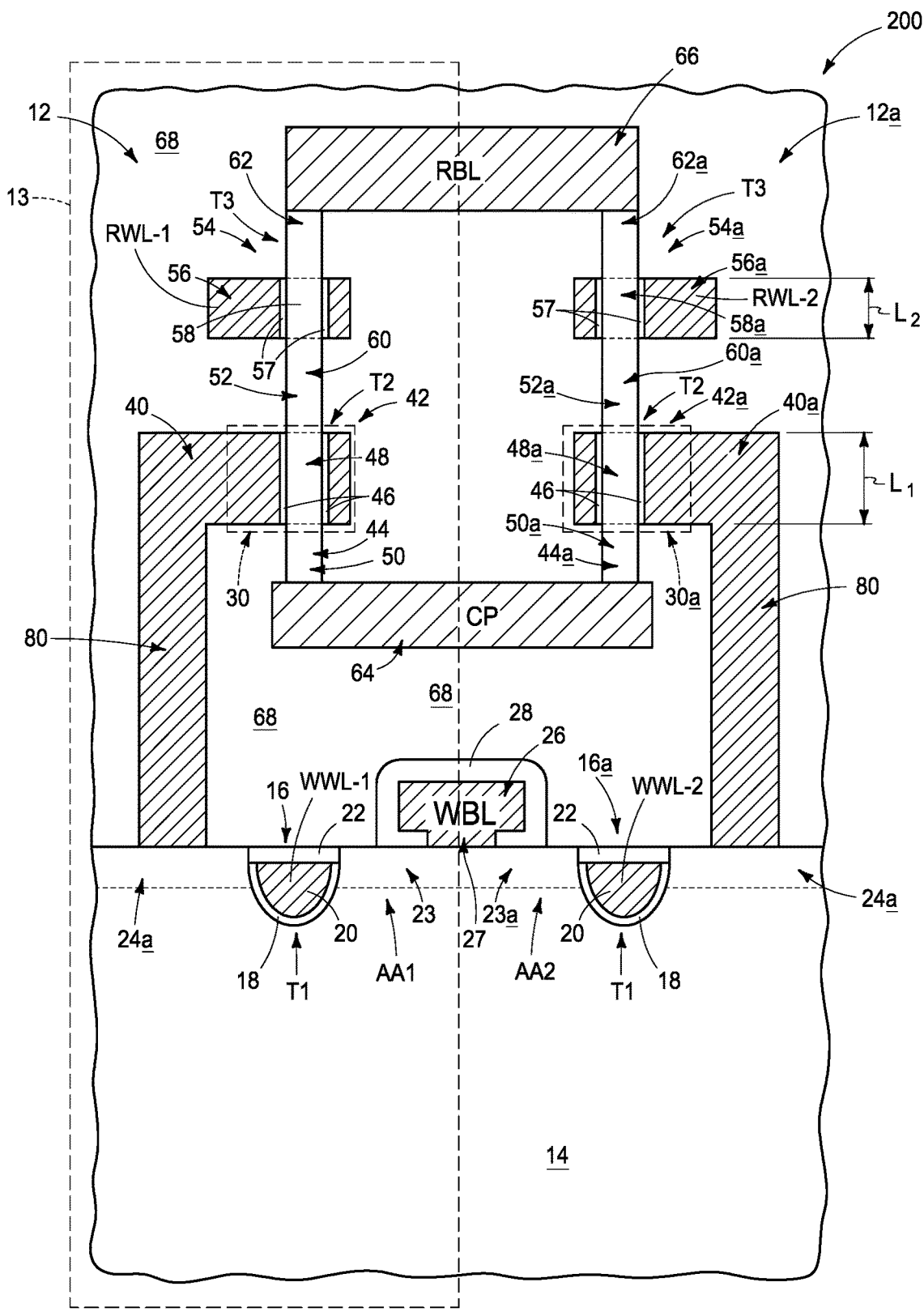

FIG. 6 shows a portion of an example embodiment memory array 200 illustrating another alternative configuration of capacitors 30 and 30a in the 3T-1C memory cells 12 and 12a.

The capacitors 30 and 30a of FIG. 6 are between channel regions of the second transistors T2 (channel regions 48 and 48a) and gates of the second transistors T2 (i.e., gates 40 and 40a). In some embodiments the capacitors 30 and 30a may comprise the gate dielectric material 46 of the T2 transistors, and may correspond to capacitive properties associated with such gate dielectric material during operation of the transistors. In other words, the second transistor T2 functions as the capacitor 30 if the second transistor T2 has enough gate capacitance. Thus, in some embodiments, the channel region of the second transistor T2 (channel regions 48 and 48a) is larger than the channel region of the third transistor T3 (channel regions 58 and 58a) in length to achieve adequate gate capacitance. In the embodiment of FIG. 6, the channel regions of T2 are shown having a length $L_1$, and the channel regions of T3 are shown having a length $L_2$, with $L_2$ being less than $L_1$.

The embodiment of FIG. 6 comprises interconnects 80 extending from source/drain regions 24/24a of the T1 transistors to the gates 40/40a of the T2 transistors. Such interconnects may comprise a same conductive composition as gates 40/40a in some embodiments, and may comprise different compositions relative to gates 40/40a in other embodiments.

The illustrated capacitors in the above-described embodiments of FIGS. 3-6 may be replaced with other capacitive units in other embodiments. For instance, any of the capacitors may be replaced with a capacitive unit having two or more capacitors in combination.

The transistors T1, T2 and T3 of the above-described embodiments may comprise any suitable configurations. For instance, in the illustrated embodiment the transistors are field effect transistors, but in other embodiments other suitable transistors may be substituted for one or more of the transistors T1, T2 and T3; with bipolar junction transistors being an example of a transistor configuration which may be used alternatively to field effect transistors. The field effect transistors described herein may utilize gate dielectric material comprising non-ferroelectric material and/or ferroelectric material depending on the application. The gates of the transistors may have any of numerous configurations, with some example configurations be described with reference to FIGS. 7-11. The figures specifically pertain to the T3 transistor gates, but in other embodiments analogous configurations may be utilized for the T1 and/or T2 transistor gates.

Figure 7:
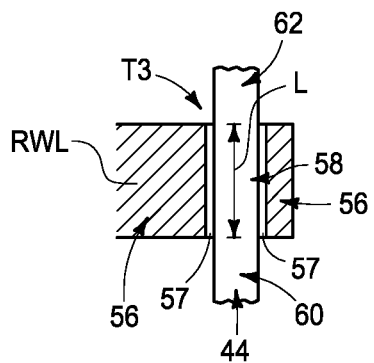
FIGS. 7-11 are regions of T3 transistors showing example embodiment configurations of such transistors.
Figure 8:
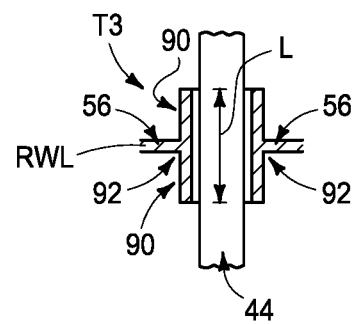
Figure 9:
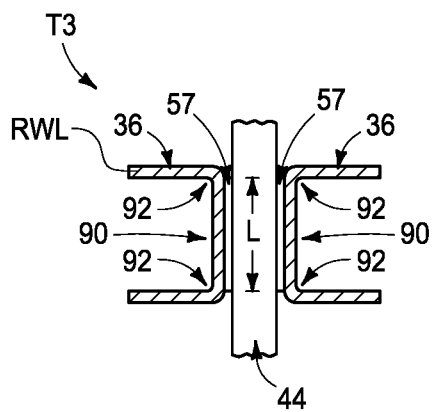
Figure 10:
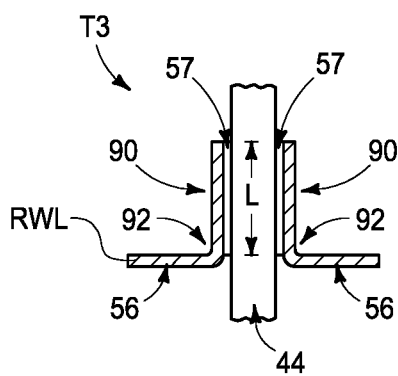
Figure 11:
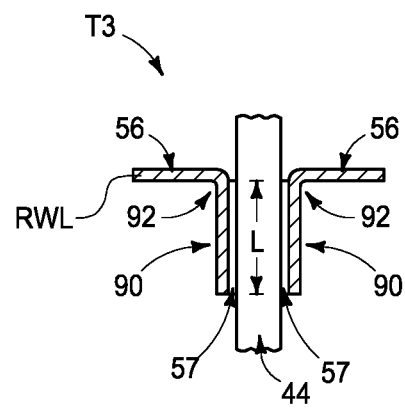

Referring to FIG. 7, the T3 transistor gate is shown in a configuration of the type utilized in the embodiments of FIGS. 3, 5 and 6. Specifically, the transistor gate 56 is a block of uniform width, with such width being approximately equal to a length "L" of the channel region 58. In contrast, each of the embodiments of FIGS. 8-11 has the gate narrower than the length of the channel region, and has at least one extension region 90 that extends along the channel region. Further, each of the embodiments of FIGS. 8-11 has at least one bent region 92 where the gate 56 joins to an extension region. The embodiment of FIG. 8 shows the gate 56 and extension regions 90 forming a substantially T-shaped configuration, the embodiment of FIG. 9 shows the extension region 90 and gate 56 together forming a substantially U-shaped configuration, and the embodiments of FIGS. 10 and 11 show the gate 56 and extension regions 90 forming substantially shelf-shaped configurations (with FIG. 11 showing the gate 56 as a top shelf over an extension region 90 and FIG. 10 showing the gate 56 as a bottom shelf beneath an extension region 90).

Advantages of the embodiments of FIGS. 8-11 relative to that of FIG. 7 may include reduced gate resistance and associated reduced current requirements for desired access drive parameters.

The structures and architectures described above may be incorporated into memory (e.g., DRAM, SRAM, etc.) and/or otherwise may be utilized in electronic systems. Such electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory cell which has a first transistor supported by a semiconductor base, and which has second and third transistors above the first transistor and vertically stacked one atop the other.

Some embodiments include a memory cell comprising first, second and third transistors. The third transistor is above the second transistor, and the second and third transistors are above the first transistor. The first transistor has first and second source/drain regions, the second transistor has third and fourth source/drain regions, and the third transistor has fifth and sixth source/drain regions. The memory cell includes a pillar of semiconductor material extending through the second and third transistors. The pillar of semiconductor material includes the third, fourth, fifth and sixth source/drain regions as well as channel regions of the second and third transistors.

Some embodiments include a memory cell having first, second and third transistors. The third transistor is above the second transistor, and the second and third transistors are above the first transistor. The first transistor has first and second source/drain regions electrically coupled to one another through a first channel region, the second transistor has third and fourth source/drain regions electrically coupled to one another through a second channel region, and the third transistor has fifth and sixth source/drain regions electrically coupled to one another through a third channel region. The fourth and fifth source/drain regions are electrically coupled to one another. A read bitline is above the third transistor and electrically coupled with the sixth source/drain region. A write bitline is adjacent the first transistor and electrically coupled with the first source/drain region. A write wordline includes a gate of the first transistor. A read wordline includes a gate of the third transistor. A capacitor is electrically coupled with the second source/drain region and is electrically coupled with a gate of the second transistor.

Some embodiments include an apparatus which comprises a semiconductor base and a plurality of memory cells; and each of the plurality of memory cells comprises first and second transistors. The first transistor includes first and second source/drain regions formed in the semiconductor base, a first channel region therebetween and a first gate controlling the first channel region, and the first gate is electrically connected to a first wordline. The second transistor includes third and fourth source/drain regions, a second channel region therebetween and a second gate controlling the second channel region. The third and fourth source/drain regions and the second channel region are vertically disposed with one another between a first bitline and a common plate over the semiconductor base, and the second gate is electrically coupled to the second source/drain region of the first transistor.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell comprising:
   a first transistor supported by a semiconductor base, the semiconductor base comprising monocrystalline semiconductor material;
   a write wordline which includes a gate of the first transistor;
   second and third transistors above the first transistor and vertically stacked one atop the other; the first, second and third transistors ascending upwardly relative to the semiconductor base in an order proceeding from the first transistor to the second transistor to the third transistor;
   a semiconductor material pillar extending continuously through both of the second transistor and the third transistor, the semiconductor material pillar having a bottom surface that is elevationally above an upper surface of the semiconductor base and elevationally above an uppermost surface of the first transistor, the semiconductor material pillar having opposing continuously vertical sidewalls throughout an entirety of a vertical length and comprising channel regions and source/drain regions of both the second transistor and the third transistor;
   a charge-storage device electrically coupled with a source/drain region of the first transistor, and electrically coupled with a gate of the second transistor; and
   wherein the charge-storage device is a capacitor between a channel region of the second transistor and the gate of the second transistor.

2. A memory cell comprising:
   a first transistor supported by a semiconductor base, the semiconductor base comprising monocrystalline semiconductor material;
   a write wordline which includes a gate of the first transistor;
   second and third transistors above the first transistor and vertically stacked one atop the other; the first, second and third transistors ascending upwardly relative to the semiconductor base in an order proceeding from the first transistor to the second transistor to the third transistor;
   a semiconductor material pillar extending through both of the second transistor and the third transistor and not extending through the first transistor, the semiconductive material pillar having opposing continuously vertical sidewalls throughout an entirety of a vertical length and comprising channel regions and source/drain regions of both the second transistor and the third transistor;
a charge-storage device electrically coupled with a source/drain region of the first transistor, and electrically coupled with a gate of the second transistor; and
wherein the charge-storage device is a capacitor comprising a dielectric material of the second transistor.

3. The memory cell of claim 2 wherein the dielectric material of the second transistor includes silicon oxide.

* * * * *